(12) United States Patent
Ishizawa et al.

(10) Patent No.: US 6,466,835 B1
(45) Date of Patent: Oct. 15, 2002

(54) DEADLOCK AVOIDANCE METHOD AND TREATMENT SYSTEM FOR OBJECT TO BE TREATED

(75) Inventors: Shigeru Ishizawa, Yamanashi-Ken; Hiroaki Saeki, Shirane-Machi, both of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/521,999

(22) Filed: Mar. 9, 2000

Related U.S. Application Data

(63) Continuation of application No. PCT/JP98/04083, filed on Sep. 10, 1998.

(30) Foreign Application Priority Data

Sep. 10, 1997 (JP) .............................................. 9-262678

(51) Int. Cl.[7] .............................................. G06F 19/00
(52) U.S. Cl. ...................................... 700/112; 700/100
(58) Field of Search ......................... 700/99–105; 1/112

(56) References Cited

U.S. PATENT DOCUMENTS

| | | | | |
|---|---|---|---|---|
| 5,038,290 A | * | 8/1991 | Minami et al. ............. | 700/100 |
| 5,093,794 A | * | 3/1992 | Howie et al. ............... | 700/100 |
| 5,231,567 A | * | 7/1993 | Matoba et al. .............. | 700/100 |
| 5,237,508 A | | 8/1993 | Furukawa .................... | 364/468 |
| 5,268,838 A | * | 12/1993 | Ito .............................. | 700/99 |
| 5,280,425 A | * | 1/1994 | Hogge ......................... | 712/300 |
| 5,914,879 A | * | 6/1999 | Wang et al. ................ | 700/111 |
| 5,928,389 A | * | 7/1999 | Jevtic ......................... | 29/25.01 |
| 5,934,856 A | * | 8/1999 | Asakawa et al. ........... | 414/217 |
| 6,078,982 A | * | 6/2000 | Du et al. ..................... | 710/200 |
| 6,122,566 A | * | 9/2000 | Nguyen et al. ............. | 700/218 |
| 6,336,204 B1 | * | 1/2002 | Jevtic ............................ | 716/1 |

FOREIGN PATENT DOCUMENTS

| | | |
|---|---|---|
| JP | 8-36410 | 7/1994 |
| JP | 9-129708 | 10/1995 |
| JP | 07-335711 A | * 12/1995 |
| JP | 08-016662 A | * 1/1996 |
| JP | 11-087466 A | * 3/1999 |
| WO | WO 91/01850 | 2/1991 |
| WO | 99-13503 A1 | * 3/1999 |

* cited by examiner

*Primary Examiner*—Maria N. Von Buhr
(74) *Attorney, Agent, or Firm*—Smith, Gambrell & Russell, LLP

(57) ABSTRACT

In a deadlock avoidance method of the present invention, after setting two kinds of transport routes, it is determined whether each of treatment chambers located on the respective transport routes is located upstream or downstream of other treatment chambers on a transport route formed by integrating the transport routes, and an upstream/downstream table indicative of an upstream/downstream relationship between the respective treatment chambers on all the transport routes. When it is determined that a common treatment chamber corresponds to both of upstream and downstream positions while preparing the upstream/downstream table, it is determined that the wafers cause a deadlock.

13 Claims, 5 Drawing Sheets

DEADLOCK AVOIDANCE METHOD AND TREATMENT SYSTEM FOR OBJECT TO BE TREATED

This application is a Continuation of PCT/JP98/04083, filed Sep. 10, 1998, which application is incorporated herein by reference.

BACKGROUND OF THE INVENTION

1. Field of the Invention

The present invention relates generally to a deadlock avoidance method and a treatment system for an object to be treated.

2. Related Background Art

In recent years, various domestic electric appliances, such as televisions and stereos, and various electric appliances, such as information apparatuses including personal computers, are produced, and these electric appliances are in multi-product small-scale production ages. Consequently, various semiconductor products, such as high and low function products, are used for the electric appliances.

Production processes for semiconductor products include various processes, such as treatment, inspection and assembly processes for, e.g., semiconductor wafers (which will be hereinafter simply referred to as "wafers"). For example, there are various treatment processes, such as a thin film deposition process for depositing thin films including a conductive film and an insulator film on a wafer surface, an etching process for forming a predetermined shape of opening in the respective films, and an embedding process for the opening. For these processes, e.g., a multi-chamber treatment system (which will be hereinafter simply referred to as a "treatment system") is widely used. This treatment system has a plurality of treatment chambers for carrying out different treatments so that a plurality of treatments, such as thin film deposition treatments and etching treatments, can be sequentially carried out by means of a single system.

However, semiconductor products have been miniaturized decreasingly to greatly enhance the degree of integration thereof to scale down and multilayer the wiring structure to increase the number of treatment processes for wafers. For that reason, it is very important how to increase the throughput for the processes. At this point, the above described treatment system can achieve a plurality of treatments with a high throughput by a single system to be used for general purpose. In addition, as the number of treatments increases, the number of treatment chambers of the treatment system increases as many as possible. However, there are various semiconductor products, for which a large number of treatments and a small number of treatments are carried. Therefore, in accordance with the kind of the semiconductor products, there are some cases where all the treatment chambers are used or a part of the treatment chambers are not used. There are also same cases where the same treatment chamber is doubly used.

However, in the case of conventional treatment systems, since wafers are sequentially treated every one kind of wafers in accordance with the kind of the wafers, the treatment chamber may have play for some kinds of wafers, so that the treatment chambers can not often be efficiently used as a whole. In addition, as various semiconductor products are produced in recent years, the treatment chamber has often play if wafers are sequentially treated for every kind of the wafers, so that there are problems in that the efficiency of use of the treatment chambers as a whole decreases to cause the throughput to remarkably decrease.

On the other hand, when a plural kinds of objects, to which different treatments are to be carried out, are treated in parallel in order to enhance the efficiency of use of the treatment chambers as a whole, it is likely that a deadlock may occur in a common treatment chamber wherein different kinds of objects to be treated are located on the respective transport routes, so that a plural kinds of objects, to which different treatments are to be carried out, can not be treated in parallel without establishing any fundamental rules.

SUMMARY OF THE INVENTION

It is therefore an object of the present invention to eliminate the aforementioned problems and to provide a deadlock avoidance method and a treatment system for objects to be treated, which can treat a plural kinds of objects, to which different treatments are to be carried out, in parallel to the utmost and which can use a plurality of treatment chambers to the maximum to enhance throughput so as to be suitable for multi-product small-scale production.

In order to accomplish the aforementioned and other objects, according to the present invention, when a plural kinds of objects, to which different treatments are to be carried out, are treated in parallel, it is possible to simply determine whether a deadlock is caused by the relationship between the plural kinds of objects to be treated.

When it is determined that no deadlock is caused by the relationship between the plural kinds of objects to be treated, it is possible to treat the plural kinds of objects in parallel, and it is not required to sequentially treat the plural kinds of objects one kind at a time every one kind thereof, so that it is possible to efficiently use the treatment chambers as a whole.

When it is determined that a deadlock is caused by the relationship between the plural kinds of objects to be treated, it is not possible to treat the plural kinds of objects in parallel, so that the objects are sequentially treated one kind at a time every one kind thereof.

However, even if it is determined that a deadlock is caused by the plural kinds of objects, to which different treatments are to be carried out, a part of the objects are treated in parallel as follows. That is, on the basis of the determined results that the deadlock is caused by the relationship between the plural kinds of objects, to which different treatments are to be carried out, the objects are sequentially treated one kind at a time every one kind thereof. In this case,there are some cases where the deadlock is not caused by the relationship between the final object of a group of objects, which has been treated in former sequence, and the first object of a group of objects, which is treated in latter sequence, the final object of the group of objects, which has been treated in former sequence, and the first object of the group of objects, which is treated in latter sequence, are treated in parallel to improve the treatment speed.

According to one aspect of the present invention, there is provided a method for avoiding causing a deadlock in a common treatment chamber, which is one of a plurality treatment chambers of a treatment system for transporting a plural kinds of objects along a plurality of transport routes to carry out different treatments for the objects and which is common to different transport routes of the plurality of transport routes for transporting different kinds of objects of the plural kinds of objects, when the plural kinds of objects are transported along the different transport routes to carry out predetermined treatments for the objects in the plurality of treatment chambers on the different transport routes, the method comprising the steps of: setting the plural kinds of transport routes in the treatment chamber; determining whether each of the plurality of treatment chambers located on the set transport routes is located upstream or downstream of other treatment chambers of the plurality of treatment chambers on the whole transport route including the different transport routes; preparing an upstream/downstream table indicative of an upstream/downstream relationship of each of the plurality of treatment chambers with other treatment chambers of the plurality of treatment chambers, on the basis of the determined results whether each of the plurality of treatment chambers is located upstream or downstream of the other treatment chambers; and determining that the objects cause a deadlock, when the common treatment chamber corresponds to both of upstream and downstream positions while the upstream/downstream table is prepared.

In this deadlock avoidance method, when it is determined by the upstream/downstream table that the objects cause no deadlock in the common treatment chamber, the different kinds of objects may be transported along the corresponding transport routes to be treated in parallel.

When it is determined by the upstream/downstream table that the objects cause a deadlock in the common treatment chamber, one of the different kinds of objects, which causes the deadlock, may be transported to be treated, and the other object of the different kinds of objects may be transported to be treated in parallel to the one of the objects when deadlock does not yet occur.

The upstream/downstream table may be updated in accordance with the progress status of the objects.

The upstream/downstream table may be formed by arranging the set treatment chambers in a matrix form of rows and columns, determining whether a treatment chamber arranged in a predetermined column is located upstream or downstream of a treatment chamber arranged in a predetermined row or determining whether a treatment chamber arranged in a predetermined row is located upstream or downstream of a treatment chamber arranged in a predetermined column, and indicating the determined result in the predetermined row and the predetermined column.

According to another aspect of the present invention, there is provided a treatment system which has a plurality of treatment chambers and which is capable of avoiding causing a deadlock in a common treatment chamber wherein different kinds of objects to be treated are located on transport routes therefor, the treatment system comprising: transport means for transporting a plural kinds of objects to be treated, which are supported on a supporting member, one by one; a plurality of treatment chambers for sequentially carrying out a predetermined treatment for the objects transported by the transport means; and control means for controlling the transport means and the plurality of treatment chambers, the control means comprising: program storage means for storing a deadlock avoidance program; table preparing means for determining whether each of the treatment chambers located on the set transport routes is located upstream or downstream of other treatment chambers on the whole transport route including the different transport routes, in accordance with the deadlock avoidance program, to prepare an upstream/downstream indicative of an upstream/downstream relationship of each of the treatment chambers with other treatment chambers on the basis of the determined result; deadlock determining means for determining that the objects cause a deadlock, when it is determined that the common treatment chamber corresponds to both of upstream and downstream positions while the upstream/downstream table is prepared by the table preparing means; and deadlock determining means for determining that a deadlock is caused, when the common treatment chamber corresponds to both of upstream and downstream positions while the upstream/downstream table is prepared by the table preparing means, thereby avoiding causing a deadlock in the common treatment chamber wherein different kinds of objects to be treated are located on the transport routes, when the plural kinds of objects, to which different treatments are carried out, are transported along different transport routes to carry out predetermined treatments for the objects in the plurality of treatment chambers located on the transport routes.

The control means may have table updating means for sequentially updating the upstream/downstream table.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, particularly to FIGS. 1 through 8, the preferred embodiments of the present invention will be described below.

Figure 1:
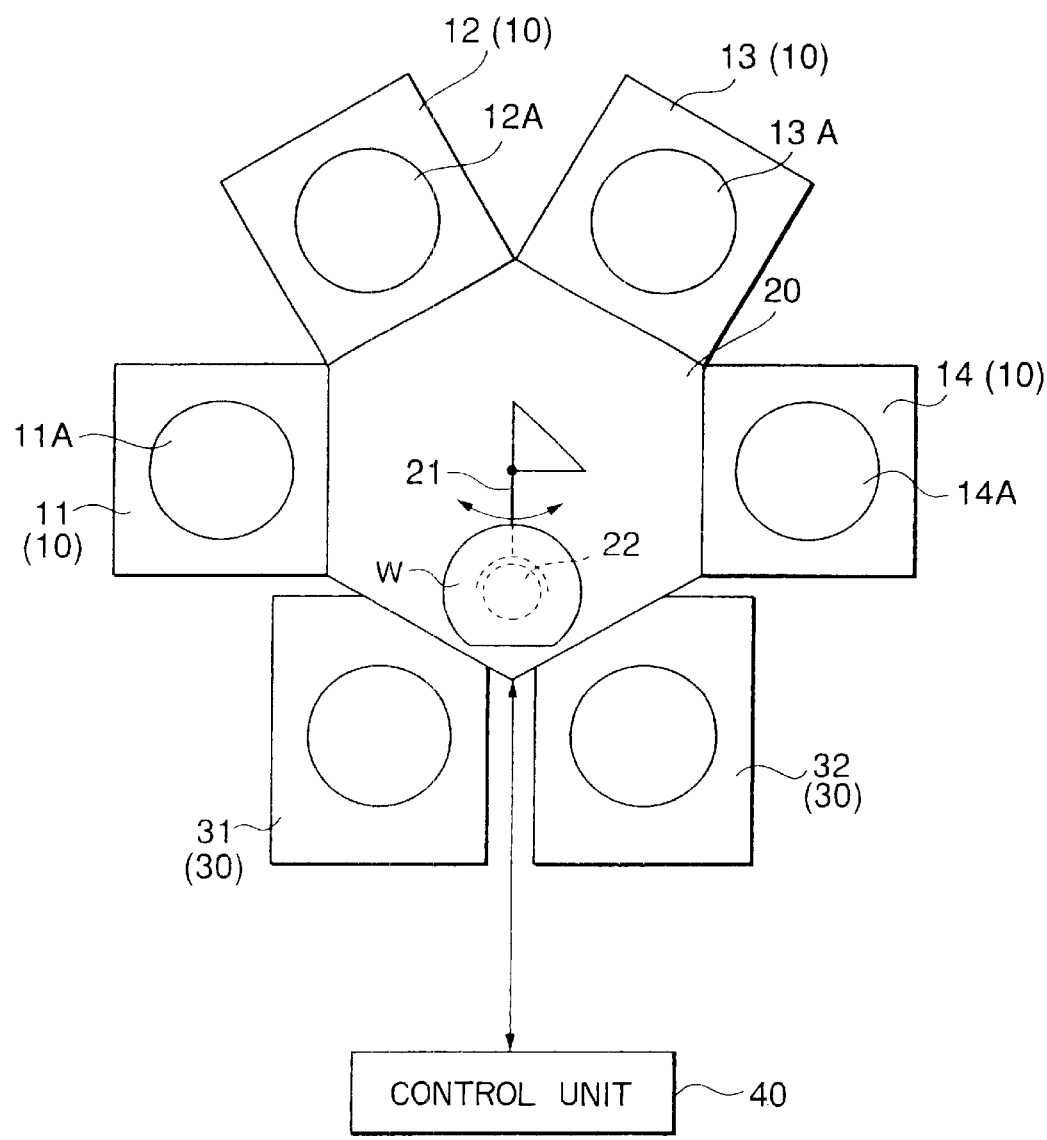
FIG. 1 is a plan view of a preferred embodiment of a treatment system accord the present invention.

As shown in FIG. 1, a multi-chamber treatment system (which will be hereinafter simply referred to as a "treatment system") in this preferred embodiment comprises: treatment chambers 10 for sequentially carrying out four kinds of treatments, such as thin film deposition treatments and etching treatments; a hexagonal transfer chamber 20 connected to the treatment chambers 10 via gate valves (not shown) so that the communications between the transfer chamber 20 and the treatment chambers 10 are established and blocked by the gate valves; and right and left wafer housing chambers 30, which are connected to the transfer chamber 20 via gate valves (not shown) so that the communications between the wafer housing chamber 30 and the transfer chamber 20 are established and blocked by the gate valves and which are provided for housing therein two kinds of wafers W, to which different treatments are to be carried out. These are driven by a control unit 40. Furthermore, the four treatment chambers 10 and the right and left wafer housing chamber 30 will be hereinafter referred to as "first through fourth treatment chambers 11 through 14" and "first and second wafer housing chambers 31 and 32", respectively, if necessary. The respective treatment chambers 10 and the wafer housing chambers 30 will be separately described below.

In the first through fourth treatment chambers 11 through 14, susceptors 11A through 14A for mounting the wafers W thereon are provided, respectively, so that predetermined treatments are carried out on the respective susceptors 11A through 14A.

In the transfer chamber 20, a wafer transport unit 21 and a positioning unit 22 are provided. The wafers W are transported, one by one, from the first and second wafer housing chambers 31 and 32 by means of a single handling arm of the wafer transport unit 21. In the middle of transportation, the central positions of the wafers W are corrected and the wafers W are turned to a predetermined direction by means of the positioning unit 22. Thereafter, the wafers W are transported to the respective treatment chambers 10. The wafer transport unit 21 is designed to sequentially transport the wafers W along the transport routes for the wafers W to the respective treatment chambers 10 by means of the single handling arm thereof and to transport the finally treated wafers W from the corresponding treatment chamber 10 to the original position in the original wafer housing chamber 30.

Figure 2:
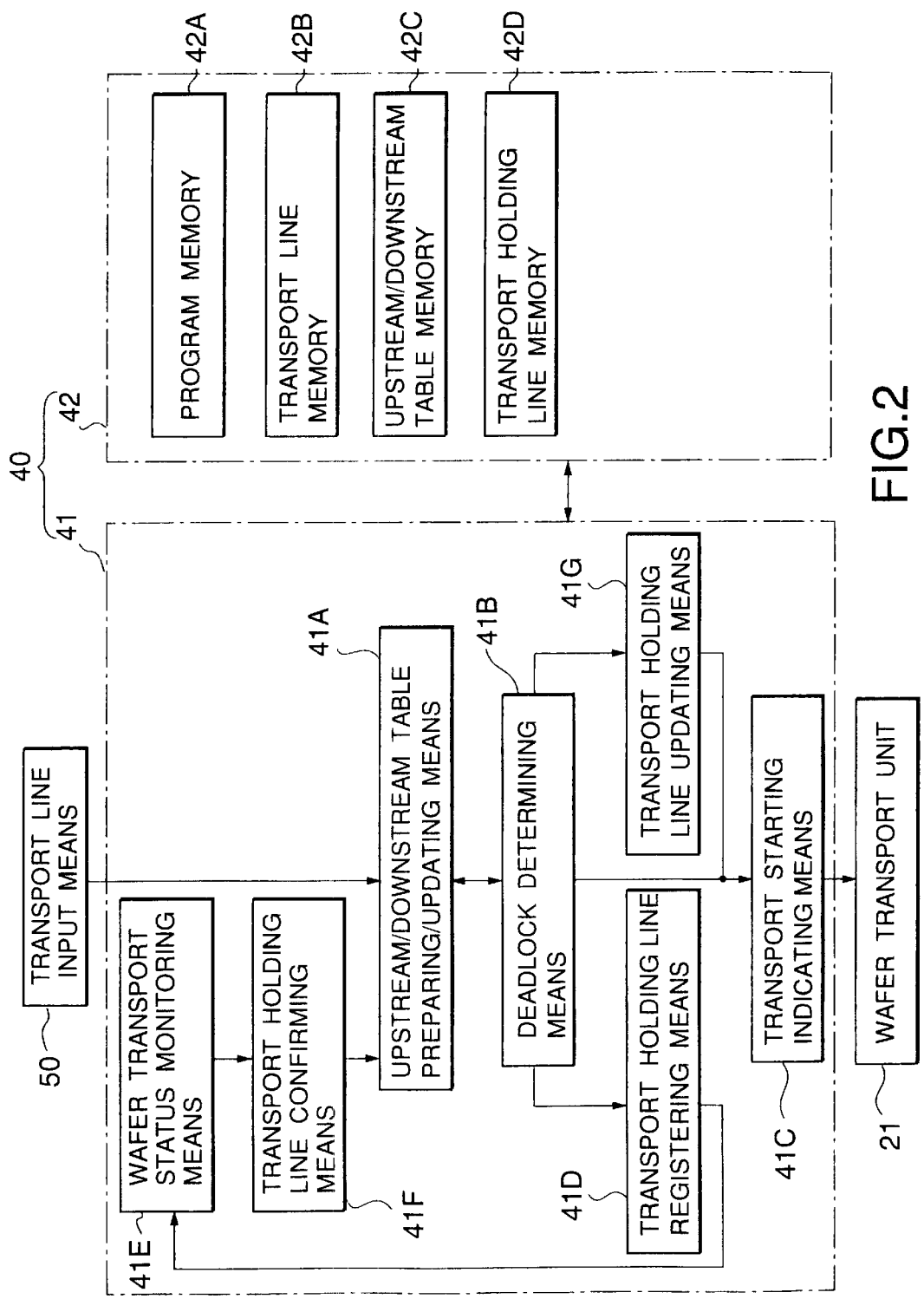
FIG. 2 is a block diagram of a control unit of FIG. 1.
Figure 3:
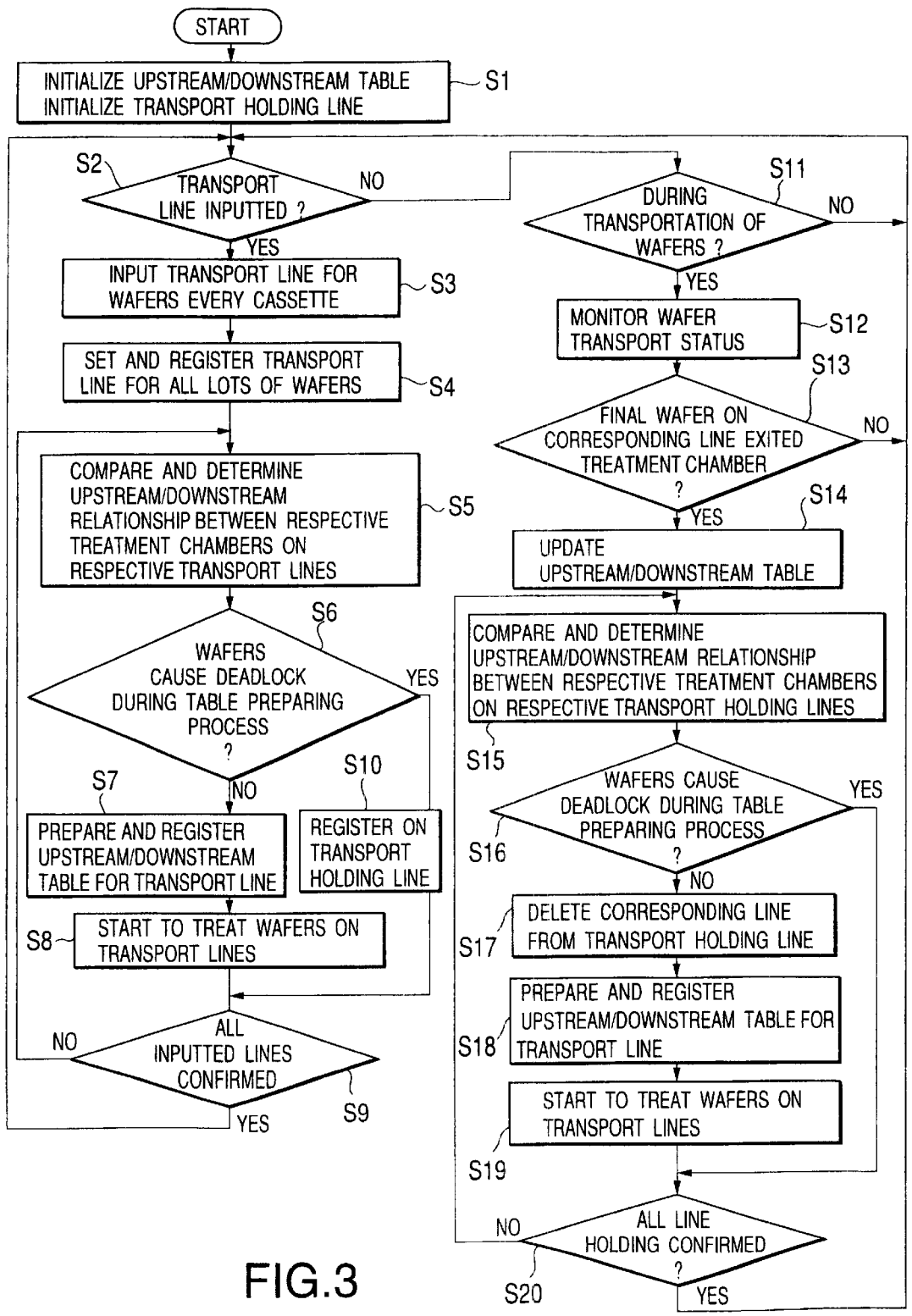
FIG. 3 is a flow chart of a preferred embodiment of a deadlock avoidance method for objects to be treated according to the present invention, which the control unit of FIG. 2 executes.

The treatment system in this preferred embodiment is driven on the basis of the control of the control unit shown in FIG. 2 in accordance with a flow chart shown in FIG. 3. For example, when two kinds of wafers W, to which different treatments are to be carried out, are transported along two kinds of transport routes (e.g., see FIG. 4) to carry out predetermined treatments for the respective wafers W in the four treatment chambers 10 arranged on the respective transport routes, the treatment system is designed to avoid causing a deadlock in the same treatment chamber 10 the two kinds of wafers W exist on the respective transport routes.

Throughout the specification, the term "deadlock" means a state that when a plural kinds of wafers W (two kinds of wafers W in this preferred embodiment), which are transported along different transport routes, are simultaneously treated in parallel, the wafers W transported along the respective transport routes meet in the same treatment chamber 10, so that the wafers W can not be treated.

Furthermore, throughout the specification, the expression "to avoid causing deadlock" does not mean to detect the actual occurrence of deadlock to carry out some treatments to avoid deadlock when a plural kinds of wafers W, which are transported along different transport routes, are simultaneously treated in parallel, but it means to determine whether a deadlock occurs and to previously avoid the parallel treatments to avoid deadlock when it is determined that a deadlock occurs.

As shown in FIG. 2, the control unit 40 in this preferred embodiment is connected to a transport route input unit 50 of, e.g., a keyboard or an operating panel displayed on a display panel of a display unit, for inputting the transport route of the wafer W. The data inputted by the transport route input unit 50 are processed by the control unit 40 to previously determine whether the wafer W causes a deadlock when being treated. Furthermore, in FIG. 4, C denotes each of the wafer housing chambers 30, and ORT denotes the positioning unit 22. In addition, P1, P2, P3 and P4 denote the first, second, third and fourth treatment chambers, respectively.

As shown in FIG. 2, the control unit 40 in this preferred embodiment has a processing unit 41 and a storage unit 42 to drive the wafer transport unit 21 on the basis of, e.g., two kinds of transport routes, inputted from the transport route input unit 50 to transport the two kinds of wafers W along the respective transport routes.

The processing unit 41 is designed to determine whether a deadlock occurs on the transport routes of the two kinds of wafers W, in accordance with a deadlock avoidance program which will be described later. The storage unit 42 comprises: a program memory 42A for storing a deadlock avoidance program for the wafers W; a transport route memory 42B for storing the transport routes for the two kinds of wafers W inputted from the transport route input unit 50; an upstream/downstream table memory 42C for storing an upstream/downstream table which will be described later; and a transport holding line memory 42D for storing a transport route for a wafer W causing deadlock as a transport holding line when the wafer W causes a deadlock between two kinds of transport routes. When the two kinds of transport routes are inputted, the respective transport routes are set and registered in the transport route memory 42B by means of the processing unit 41 regardless of the presence of deadlock.

As shown in FIG. 2, the processing unit 41 includes: a table preparing/updating means 41 for determining whether one of the treatment chambers 10 arranged on two kinds of transport routes is located upstream or downstream of another chamber, in accordance with the deadlock avoidance program, to prepare an upstream/downstream table shown in, e.g., Table 1, which shows the upstream/downstream relationship between the respective treatment chambers on all the transport routes; and a deadlock determining means 41B for determining deadlock when the same treatment chamber 10 corresponds to both of upstream and downstream positions while the upstream/downstream table is prepared by the table preparing/updating means 41A.

Table 1 shows an example of the upstream/downstream table. For example, term C defined by row A and column B in Table 1 shows whether a treatment chamber in column B (P1 in Table 1) is located upstream or downstream of a treatment chamber in row A (P3 in Table 1). Table 1 shows that the treatment chamber in column B is located upstream of the treatment chamber in row A.

The table preparing/updating means 41A may determine whether one of the treatment chambers 10 arranged on two kinds of transport routes is located upstream or downstream of another chamber to prepare an upstream/downstream table shown in, e.g., Table 2, which shows the upstream/downstream relationship between the respective treatment chambers on all the transport routes. Table 2 shows that the same treatment chamber 10 corresponds to both of upstream and downstream positions in, e.g., row A and column B or row C and column D as will be described later.

The deadlock determining means 41B determines the presence of deadlock while the table preparing/updating means 41A prepares the upstream/downstream table, in the following manner.

That is, for example, as shown by row A and column B in the preparing process of Table 2, the treatment chamber in column B (P1 in Table 2) is located "upstream" of the treatment chamber in row A (P3 in Table 2) in the treatment process shown in FIG. 4(a) and "downstream" of the treatment chamber in row A in the treatment process shown in FIG. 4(b), i.e., there is either case where one is located upstream or downstream of the other. Therefore, when the treatment processes shown in FIGS. 4(a) and 4(b) are carried out in parallel, a deadlock may occurs. In such a case, the deadlock determining means 41B determines that the same treatment chamber 10 corresponds to both of upstream and downstream positions to cause a deadlock.

When it is determined that no deadlock occurs on the basis of the results determined by the deadlock determining means 41B, the table preparing/updating means 41A prepares the upstream/downstream table. The prepared upstream/downstream table is set and registered in the upstream/downstream table memory 42C by means of the table preparing/updating means 41A. In this case, parallel processes can be carried out.

When it is determined that a deadlock occurs on the basis of the results determined by the deadlock determining means 41B, a transport route causing deadlock is set and registered in the transport holding line memory 42D without preparing the upstream/downstream table. In this case, a group of objects to be treated, which is located in the transport route causing deadlock which has been set and registered in the transport holding line memory 42D, is waiting without being treated in parallel at this place. This group of objects to be treated starts to be first treated when the final object of a group of objects to be treated in the other transport route is treated.

The processing unit 41 also has a transport starting indicating means 41C for transmitting a transport starting indicating signal to the wafer transport unit 21 on the basis of a signal, which is received from the deadlock determining means 41B and which indicates that no deadlock occurs, to transport the wafers W.

As shown in FIG. 2, the processing unit 41 also has a transport holding line registering means 41D, a wafer transport status monitoring means 41E, a transport holding line confirming means 41F and a transport holding line updating means 41G.

When a deadlock occurs, the transport holding line registering means 41D sets and registers a transport route causing deadlock in the transport holding line memory 42 on the basis of a deadlock signal outputted from the deadlock determining means 41B. The wafer transport status monitoring means 41E sequentially monitors the transport status of the wafers W in the system on the basis of a signal outputted from the transport holding line registering means 41D, and the upstream/downstream table preparing/updating means 41A sequentially updates the contents of the upstream/downstream table memory 42C. In parallel to this, the transport holding line confirming means 41F confirms the contents of the transport holding line memory 42D on the basis of a signal outputted from the wafer transport status monitoring means 41E, and transmits the results to the upstream/downstream table preparing/updating means 41A. Then, the upstream/downstream table preparing/updating means 41 and the deadlock determining means 41B are designed to always monitor whether a wafer in a transport holding line and a transported wafer are associated with each other to cause a deadlock, on the basis of a signal outputted from the transport holding line confirming means 41F.

As described above, the group of objects to be treated, which has been set and registered in the transport holding line memory 42D as a group of objects causing deadlock, is waiting without being treated in parallel until the final object of a group of objects to be treated in the currently executed transport route is treated. Then, the time that no deadlock occurs with the final object of the group of objects to be treated in the currently executed transport route is derived by the upstream/downstream table preparing/updating means 41A and the deadlock determining means 41B.

At the same time that it is determined by the deadlock determining means 41B that no deadlock occurs between the wafers in the transport holding line and the currently transported wafers, the upstream/downstream table preparing/updating means 41A prepares an upstream/downstream table having both of the currently executed transport route and the transport holding line, and updates the contents of the upstream/downstream table memory 42C.

The transport holding line updating means 41G deletes a transport route stored in the transport holding line memory 42D as a transport route which does not yet cause a deadlock, on the basis of the determination of the deadlock determining means 41B, and updates the contents thereof. In addition, the transport holding line updating means 41G transmits a transport starting indicating signal to the wafer transport unit 21 via the transport starting indicating means 41C to start to transport the wafers W in the transport route which has been held.

Thus, the group of objects to be treated in the transport route, which has been set and registered in the transport holding line memory 42D as a group of objects causing deadlock, can be treated in parallel to the final object of the group of objects to be treated in the currently executed transport route.

Referring to the flow chart of FIG. 3 and the transport routes of FIG. 4, the preferred embodiment of a deadlock avoidance method according to the present invention, which is carried out by means of a treatment system in this preferred embodiment, will be described below. Furthermore, in FIG. 4, (a) denotes a transport route (a), and (b) denotes a transport route (b).

First, when the system is started, the processing unit 41 of the control unit 40 initializes the upstream/downstream table memory 42C and the transport holding line memory 42D (S1).

Then, it is determined whether a transport route for the wafers is inputted (S2). When there is a transport route to be inputted, a transport route (a) for the wafers W is inputted by means of the transport route input unit 50, e.g., for every cassette (S3). When the transport route (a) is inputted, the transport route (a) is set and registered in the transport route memory 42B by means of the processing unit 41 of the control unit 40, and the transport route (a) is stored therein.

Then, after the upstream/downstream relationships with respect to the transport route (a) are compared and determined by means of the upstream/downstream table preparing/updating means 41A (S5), it is determined by the deadlock determining means 41B whether a deadlock occurs in the transport route (a) (S6). However, at this stage, only one transport route (a) is inputted and the wafers W do not flow in the system, so that no deadlock occurs in one transport route (a). Therefore, after the upstream/downstream table for the transport route (a) is prepared as shown in Table 1 by means of the upstream/downstream table preparing/updating means 41A to be registered in the upstream/downstream table memory 42C (S7), a transport starting indicating signal is transmitted from the transport starting indicating means 41C to the wafer transport unit 21 on the basis of a signal outputted from the deadlock determining means 41B, to start to transport the wafers W in the transport route (a) (S8). At this time, when a plurality of transport routes are inputted, the presence of deadlock is confirmed with respect to all the inputted transport routes (S9). If the confirmation of the presence of deadlock with respect to all the transport routes is not completed, the routine returns to step S5, and the processes at steps S5 through S9 are repeated to sequentially confirm the presence of deadlock between all the transport routes.

TABLE 1

B ↓

|   | ORT | P1 | P2 | P3 | P4 |
|---|---|---|---|---|---|
| ORT |   | Down (a) | Down (a) | Down (a) |   |
| P1 | Up (a) |   | Down (a) | Down (a) |   |
| P2 | Up (a) | Up (a) |   | Down (a) |   |
| P3 | Up (a) | Up (a) | Up (a) |   |   |
| P4 |   |   |   |   |   |

A →

※Up: Upstream, Down: Downstream

When the confirmation of the presence of deadlock with respect to all the inputted transport routes is completed, if there is the next transport route to be inputted, e.g., a transport route (b) is inputted by means of the transport route input means 50. In this case, the processes at steps S2 through S9 are repeated.

Figure 4:
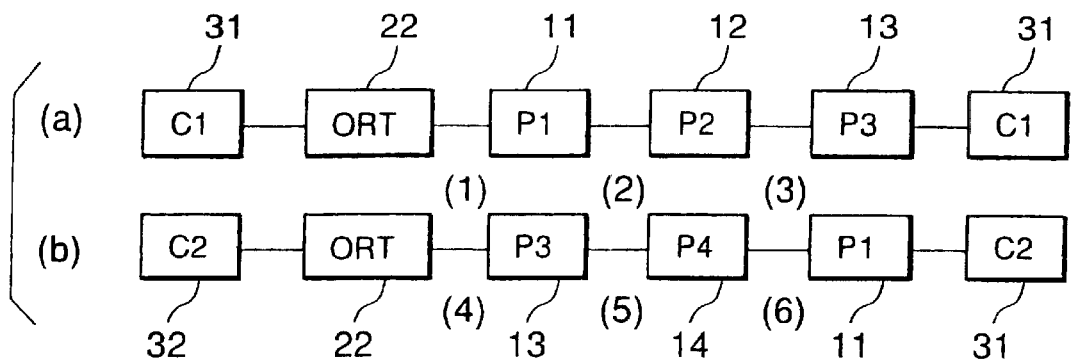
FIGS. 4(a) and 4(b) are diagrams showing transport routes for two kinds wafers in the treatment system of FIG. 1.
Figure 5:
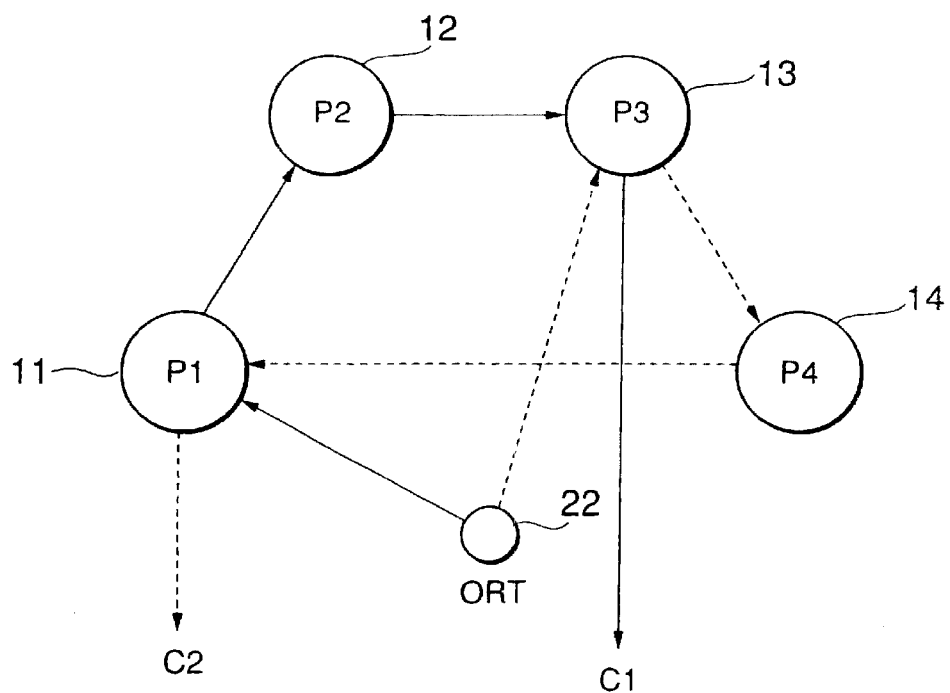
FIG. 5 is a schematic diagram for explaining the transport routes of FIGS. 4(a) and 4(b) with the arrangement of a treatment chamber of the treatment system.

That is, in the example of FIG. 4, the transport route (b) is inputted in the same procedure as that for the transport route (a) (S3) to be set and registered in the transport route memory 42B by means of the processing unit 41 (S4) to be stored therein. Then, the upstream/downstream relationships for the respective treatment chambers in the respective transport routes (a) and (b) are compared and determined (S5), and it is determined whether a deadlock occurs (S6). At this time, if the upstream/downstream table suitable for both of the transport routes (a) and (b) is prepared, Table 2 is obtained. After the comparison and determination at step S6, P1 is located upstream of P3 in the transport route (b) although P1 is located downstream of P3 in the transport route (a) as shown by * in Table 2 (row A, column B and row C, column D), so that it is determined that a deadlock occurs between the transport routes (a) and (b) (S6). In this case, it is revealed that a deadlock may occur at the stage that the term defined by row A and column B or the term defined by row C and column D is prepared in Table 2. Therefore, in such a case, it is not required to complete the preparation of the upstream/downstream table having both of the transport routes (a) and (b) as shown in Table 2. Therefore, the preparation of Table 2 is stopped. Then, the transport holding line registering means 41D is actuated on the basis of a signal outputted from the deadlock determining means 41B to set and register the transport route (b) in the transport holding line memory 42D (S10) to hold the transportation of the wafers. At this stage, the upstream/downstream table remains being shown in Table 1.

As described above, the wafers of the cassette in the transport route (b), which has been set and registered in the transport holding line memory 42D as one causing deadlock, is waiting without being treated in parallel until the final wafer of the cassette in the currently executed transport route (a) is treated. Then, the time that deadlock does not yet occur with the wafers of the cassette in the currently executed transport route (a) is derived by the upstream/downstream table preparing/updating means 41A and the deadlock determining means 41B.

TABLE 2

B ↓        D ↓

|   | ORT | P1 | P2 | P3 | P4 |
|---|---|---|---|---|---|
| ORT |   | Down (a)<br>Down (b) | Down (a) | Down (a)<br>Down (b) | Down (b) |
| P1 | Up (a)<br>Up (b) |   | Down (a) | Down (a)<br>Up* (b) | Up (b) |
| P2 | Up (a) | Up (a) |   | Down (a) |   |
| P3 | Up (a)<br>Up (b) | Up (a)<br>Down* (b) | Up (a) |   | Down (b) |
| P4 |   | Up (a) | Down (b) |   |   |

C →

A →

※Up: Upstream, Down: Downstream

When it is confirmed at step S2 that all the transport routes are inputted and the next transport route to be inputted does not exist, it is confirmed by the wafer transport status monitoring means 41E whether the wafers are transported in the system (S11). When it is confirmed that the wafers are transported, the transport status of the wafers is monitored by the wafer transport status monitoring means 41E (S12).

Then, it is confirmed by the wafer transport status monitoring means 41E whether the wafers in the transport route (a) have been sequentially transported and treated and the final wafer has been carried out of the treatment chamber P1 (S13). When it is confirmed that the final wafer has been carried out of the treatment chamber P1, the transport holding line confirming means 41F confirms the contents of the transport holding line memory 42D. Then, the upstream/downstream preparing/updating means 41A prepares an upstream/downstream table shown in Table 3, which incorporates the transport route (b) therein, and updates the contents of the upstream/downstream table memory 42C (S14).

Table 3 shows the stage that the final wafer of the cassette in the currently executed transport route (a) is treated. Since it has been determined that a deadlock occurs at * in Table 2 (row A and column B or row C and column D), the final wafer of the cassette in the transport route (a) must be treated alone until it reaches the treatment chamber defined by row A and column B or row C and column D. In a treatment chamber (the treatment chamber defined by row A and column F or row E and column D in Table 3) next to the treatment chamber defined by row A and column B or row C and column D, deadlock does not yet occur between the wafers of the cassette in the transport route (b) and the final wafer of the cassette in the transport route (a).

Moreover, when the transport holding line remains in the transport holding line memory 42D, the presence of deadlock with respect to the remaining transport holding line is confirmed. If it has not been confirmed, the routine returns to step S15, and the processes at steps S15 through S19 are repeated. When the confirmation of deadlock is completed, the routine returns to step S2 wherein the presence of the next transport route to be inputted is confirmed.

TABLE 4

|  | ORT | P1 | P2 | P3 | P4 |
|---|---|---|---|---|---|
| ORT |  | Down(b) |  | Down(b) | Down(b) |
| P1 | Up(b) |  | Down(a) | Up(b) | Up(b) |
| P2 | Up(a) | Up(a) |  | Down(a) |  |
| P3 | Up(b) | Down(b) | Up(a) |  | Down(b) |
| P4 | Up(b) | Down(b) |  |  |  |

※Up: Upstream, Down: Downstream

As described above, according to this preferred embodiment, the upstream/downstream table preparing/

TABLE 3

|  |  | B | F | D |  |
|---|---|---|---|---|---|
|  | ORT | P1 | P2 | P3 | P4 |
|  | ORT |  |  |  |  |
| C → | P1 |  |  |  |  |
| E → | P2 |  |  | Down(a) |  |
| A → | P3 |  | Up(a) |  |  |
|  | P4 |  |  |  |  |

※Up: Upstream, Down: Downstream

When the final wafer in the transport route (a) is carried out of the treatment chamber P1, the transport route (b) stored in the transport holding line memory 42D by means of the transport holding line confirming means 41F is called, and the upstream/downstream relationships between the final wafer in the transport route (a) and the wafers in the transport route (b), which are shown in Table 3, are compared and determined by means of the upstream/downstream table preparing/updating means 41A (S15). On the basis of the determined results, it is determined whether a deadlock occurs between the wafers in the transport routes (a) and (b) (S16). When it is determined that no deadlock occurs, the transport holding line updating means 42B deletes the transport route (b) from the transport holding line memory 42D (S17), and updates the contents of the transport holding line memory 42D. In addition, the upstream/downstream table preparing/updating means 41A updates the upstream/downstream table shown in Table 3 to an upstream/downstream table shown in Table 4, which is registered in the upstream/downstream table memory 42C (S18).

Thereafter, the final wafer in the transport route (a) and the wafers in the transport route (b) start to be transported in parallel (S19), and the wafers are treated in parallel.

updating means 41A determines whether each of the treatment chambers located on the respective transport routes (a) and (b) is located upstream or downstream of another treatment chamber on the whole transport route, i.e., on a transport route serving as the sum of the transport routes (a) and (b), and prepares the upstream/downstream table indicative of the upstream/downstream relationship on the whole transport route, i.e., on the transport route serving as the sum of the transport routes (a) and (b). During the preparing process of the upstream/downstream table, when the deadlock determining means 41B determines that the common treatment chamber P1, P3 corresponds to both of the upstream and downstream positions (* in Table 3), the deadlock determining means 41B determines that the wafers W on the respective transport routes (a) and (b) cause a deadlock. Thus, the upstream/downstream relationships between the respective treatment chambers on the whole transport routes are expressed as the upstream/downstream table, so that it is possible to simply, quickly and surely determine whether a deadlock occurs. As a result, it is possible to prevent a deadlock from being caused by the parallel treatment in the treatment chambers P1 and P3, and it is possible to smoothly treat two kinds of wafers to enhance throughput by separately and sequentially treating the wafers on the respective transport routes (a) and (b).

Moreover, as described above, when the deadlock determining means 41B determines that a deadlock occurs, the respective wafers on the respective transport routes (a) and (b) are transported in parallel, at the time when the upstream/downstream table preparing/updating means 41A and the deadlock determining means 41B determines on the basis of the signals outputted from the wafer transport status monitoring means 41E and the transport holding line confirming means and 41F that the respective wafers, to which different treatments are to be carried out, do not yet cause the deadlock. Therefore, it is possible to treat the final wafer on the transport route (a) and the wafers on the transport route (b) in parallel, and it is possible to reduce the waiting time in the treatment of the wafers on the transport route (b). In addition, it is possible to use the plurality of treatment chambers 10 to the maximum to enhance throughput.

Figure 6:
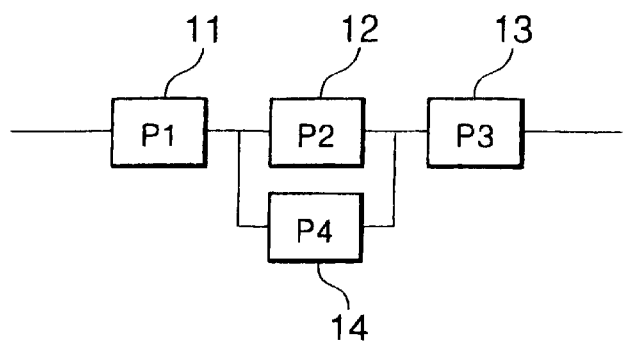
FIG. 6 is a diagram corresponding to FIG. 4, which shows another transport route, to which a deadlock avoidance method for objects to be treated according to the present invention is applied.

FIG. 6 shows a transport route formed by integrating the respective transport routes when other two kinds of wafers W are treated.

In this case, it is assumed that two kinds of wafers W are separately housed in, e.g., the first wafer housing chamber 31. One of wafers W returns to the first wafer housing chamber 31 after being treated in the first, second and third treatment chambers 11, 12 and 13 in that order. The other wafer W returns to the first wafer housing chamber 31 after being treated in the first, fourth and third treatment chambers 11, 14 and 13 in that order.

Therefore, the preparation of the upstream/downstream table on the respective transport routes for these wafers W will be described. Furthermore, in FIG. 6, the wafer housing chamber and the positioning chamber are omitted. In addition, the preparation of the upstream/downstream table is carried out in the same procedure as that in the above described preferred embodiment in accordance with the flow chart of FIG. 3.

In this preferred embodiment, the upstream/downstream relationship between the first treatment chamber 11 and the second treatment chamber 12 is determined. The second treatment chamber 12 is located downstream of the first treatment chamber 11, and the first treatment chamber 11 is located upstream of the second treatment chamber 12. Therefore, the upstream/downstream table preparing/updating means 41A writes "Downstream" in the first row and second column of an upstream/downstream table shown in FIG. 5, and "Upstream" in the second row and first column thereof.

In addition, comparing the first, second and third treatment chambers 11, 12 and 13, the third treatment chamber 13 is located downstream of the first and second treatment chambers 11 and 12. The first and second treatment chambers 11 and 12 are located upstream of the third treatment chamber 13. Therefore, the upstream/downstream table preparing/updating means 41A writes "Downstream" in the first row and third column and the second row and third column of the upstream/downstream table of FIG. 5, respectively, and "Upstream" in the third row and first column and the third row and second column thereof, respectively. Thus, the upstream/downstream relationships with respect to all the treatment chambers on the integrated transport route are compared and determined to sequentially prepare the table.

However, in this case, since all the upstream/downstream relationships between the respective treatment chambers can be written in the upstream/downstream table as "Upstream" or "Downstream" as shown in Table 5, the preparation of the upstream/downstream table is completed without stopping the preparation of the upstream/downstream table in the middle thereof. Then, after the upstream/downstream is registered in the upstream/downstream table memory 42C (S7), the deadlock determining means 41B transmits a signal to the transport starting indicating means 41C which transmits a transport starting command signal to the wafer transport unit 21 to start the parallel transport treatment of, e.g., two kinds of wafers W (S8). Thus, the single handling arm of the wafer transport unit 21 alternately transports the two kinds of wafers W, which are housed in, e.g., the first wafer housing chamber 31, one by one to treat all the two kinds of wafers W, and the wafer transport status monitoring means 41E and the transport holding line confirming means 42F always transmits the wafer transport status to the upstream/downstream table preparing/updating means 41A. Then, when the treatment for all the wafers W is completed, the upstream/downstream table preparing/updating means 41A deletes the upstream/downstream table to wait for the next treatment.

TABLE 5

|   | P1 | P2 | P3 | P4 |
|---|---|---|---|---|
| P1 |   | Down | Down | Down |
| P2 | Up |   | Down |   |
| P3 | Up | Up |   | Up |
| P4 | Up |   | Down |   |

※Up: Upstream, Down: Downstream

Figure 7:
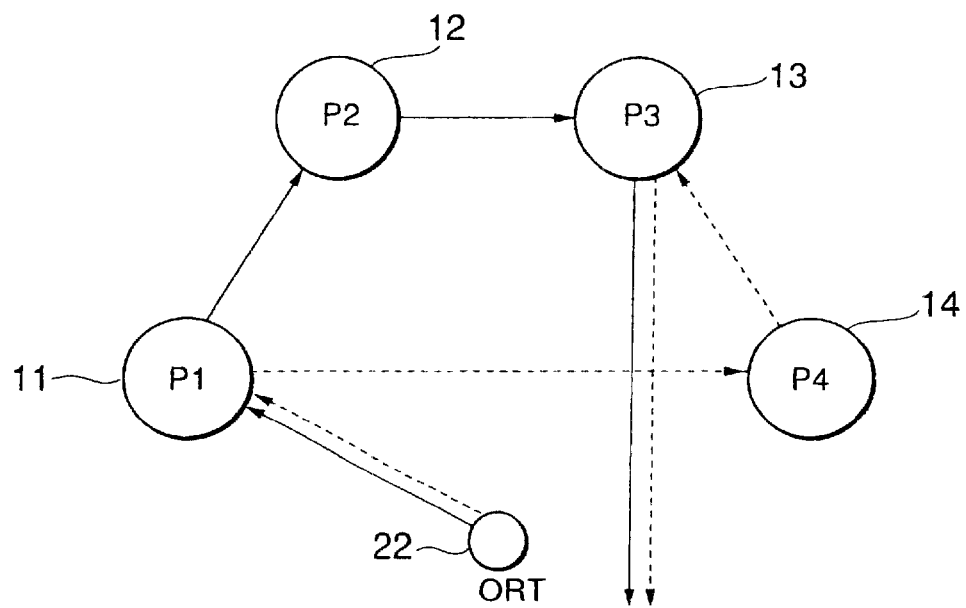
FIG. 7 is a diagram corresponding to FIG. 5, which shows the transport route of FIG. 6 with a treatment chamber of the treatment system.

When the two kinds of wafers W are transported in parallel along the transport route shown in FIG. 6, FIG. 7 is obtained. In FIG. 7, two kinds of transport routes are shown by solid lines and broken lines. As can be clearly seen from the transport routes of FIG. 7, even if the two kinds of wafers are treated in parallel, e.g., the first treatment chamber 12 corresponds to only the upstream side of the third treatment chamber 13. Therefore, the wafers W are not simultaneously carried out of the first treatment chamber 11 to the third treatment chamber 13, and the wafers W are not carried in the first treatment chamber 11 at the same time that the wafers W are carried out thereof. Consequently, the wafers W are not carried in the third treatment chamber 13 from the first treatment chamber 11 and not carried out of the third treatment chamber 13 at the same time that the wafers W are carried therein, so that no deadlock occurs in any one of the treatment chambers 11 and 13.

Therefore, according to this preferred embodiment, the upstream/downstream relationship between the respective treatment chambers 10 on the transport route shown in FIG. 6 is derived, and it is possible to determine that no deadlock occurs immediately before treatment when it is determined that the same treatment chamber 10 corresponds to only the upstream or downstream side. Therefore, on the basis of the determined results, it is not required to consider the presence of deadlock, so that it is possible to transport two kinds of wafers in parallel to efficiently use the respective treatment chambers 10 to enhance throughput.

Figure 8:
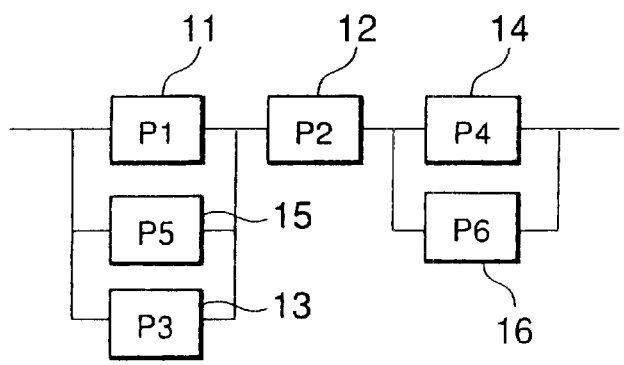
FIG. 8 is a diagram corresponding to FIG. 4, which shows a further transport route, to which a deadlock avoidance method for objects to be treated according to the present invention is applied.

FIG. 8 shows a transport route for treating a plural kinds of wafers (six kinds of wafers) using a treatment system having six treatment chambers.

The upstream/downstream relationships between the first through sixth treatment chambers 11 through 16 of this treatment system are compared to prepare an upstream/downstream table, so that it is possible to determine whether a deadlock occurs.

Therefore, similar to the aforementioned preferred embodiments, the upstream/downstream relationships between the first through sixth treatment chambers 11 through 16 are compared and the compared results are written in an upstream/downstream table while determining deadlock, so that an upstream/downstream table shown in FIG. 6 can be prepared. Thus, it can be seen that no deadlock occurs.

Therefore, it is possible to utilize the first through sixth treatment chambers 11 through 16 to the maximum to start to transport six kinds of wafers to the maximum, so that it is possible to more greatly enhance throughput than conventional systems.

TABLE 6

|    | P1 | P2   | P3 | P4   | P5 | P6   |
|----|----|------|----|------|----|------|
| P1 |    | Down |    | Down |    | Down |
| P2 | Up |      | Up | Down | Up | Down |
| P3 |    | Down |    | Down |    | Down |
| P4 | Up | Up   | Up |      |    | Up   |
| P5 |    | Down |    | Down |    | Down |
| P6 | Up | Up   | Up |      | Up |      |

※Up: Upstream, Down: Downstream

Furthermore, in the above described preferred embodiments, while wafers to be treated by different treatments have been housed in the first and second wafer housing chambers to be treated, or wafers to be treated by different treatments have been housed in the first wafer housing chamber to be treated, and while the treatment system for carrying out the thin film deposition and etching treatments for wafers has been described, the present invention should not be limited thereto, and but the invention may be applied to various semiconductor producing systems or inspection systems for treating a plural kinds of objects to be treated in parallel.

As described above, according to the present invention, it is possible to provide a deadlock avoidance method and a treatment system, which can treat a plural kinds of objects, to which different treatments are carried out, in parallel to use a plurality of treatment chambers to the maximum to enhance throughput and which is suitable for multi-product small-scale production.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for avoiding causing a deadlock in a common treatment chamber, which is one of a plurality of treatment chambers of a treatment system for transporting a plural different kinds of objects along a plural different kinds of transport routes to carry out predetermined treatments for the objects and which is common to different transport routes of the plural different kinds of transport routes for transporting different kinds of objects of the plural different kinds of objects, said deadlock avoidance method comprising the steps of:

setting said plural different kinds of transport routes in said treatment chamber;

determining whether each of said plurality of treatment chambers located on the set transport routes is located upstream or downstream of other treatment chambers of said plurality of treatment chambers on the whole transport route including said different transport routes;

preparing an upstream/downstream table indicative of an upstream/downstream relationship of each of said plurality of treatment chambers with other treatment chambers of said plurality of treatment chambers, on the basis of the determined results whether each of said plurality of treatment chambers is located upstream or downstream of said other treatment chambers; and determining that said objects cause a deadlock, when said common treatment chamber corresponds to both of upstream and downstream positions while said upstream/downstream table is prepared.

2. A deadlock avoidance method for objects to be treated, as set forth in claim 1, wherein when it is determined by said upstream/downstream table that said objects cause no deadlock in said common treatment chamber, said different kinds of objects are transported along said different transport routes to be treated in parallel.

3. A deadlock avoidance method for objects to be treated, as set forth in claim 1, wherein when it is determined by said upstream/downstream table that said objects cause a deadlock in said common treatment chamber, one of said different kinds of objects, which causes the deadlock, is transported to be treated, and the other object of said different kinds of objects is transported to be treated in parallel to said one of said objects when deadlock does not yet occur.

4. A deadlock avoidance method for objects to be treated, as set forth in claim 1, wherein said upstream/downstream table is updated in accordance with the progress status of said objects.

5. A deadlock avoidance method for objects to be treated, as set forth in claim 1, wherein said upstream/downstream table is formed by arranging the set treatment chambers in a matrix form of rows and columns, determining whether a treatment chamber arranged in a predetermined column is located upstream or downstream of a treatment chamber arranged in a predetermined row or determining whether a treatment chamber arranged in a predetermined row is located upstream or downstream of a treatment chamber arranged in a predetermined column, and indicating the determined result in the predetermined row and the predetermined column.

6. A method for avoiding causing a deadlock in a common treatment chamber, which is one of a plurality of treatment chambers of a treatment system for transporting a plural different kinds of objects along a plural different kinds of transport routes to carry out predetermined treatments for the objects and which is common to different transport routes of the plural different kinds of transport routes for transporting different kinds of objects of the plural different kinds of objects, the treatment system comprising: a transfer chamber; a plurality of treatments chambers connected to said transfer chamber via gate valves, which are capable of establishing and blocking communications between said plurality of treatment chambers and said transfer chamber, for treating said objects; and a transport system, which is provided in said transfer chamber, for transporting said object between said treatment chambers, said deadlock avoidance method comprising the steps of:

setting a plural different kinds of transport routes in said treatment chambers;

determining whether each of said plurality of treatment chambers located on the set transport routes is located upstream or downstream of other treatment chambers of said plurality of treatment chambers on the whole transport route including said different transport routes;

preparing an upstream/downstream table indicative of an upstream/downstream relationship of each of said plurality of treatment chambers with other treatment chambers of said plurality of treatment chambers, on the basis of the determined results whether each of said plurality of treatment chambers is located upstream or downstream of said other treatment chambers; and determining that said objects cause a deadlock, when said common treatment chamber corresponds to both of upstream and downstream positions while said upstream/downstream table is prepared.

7. A method for avoiding causing a deadlock in a common treatment chamber, which is one of a plurality of treatment chambers of a treatment system for transporting a plural different kinds of objects along a plural different kinds of transport routes to carry out predetermined treatments for the objects and which is common to different transport routes of the plural different kinds of transport routes for transporting different kinds of objects of the plural different kinds of objects, said deadlock avoidance method comprising:

a step of initializing an upstream/downstream table;

a step group A; and a step group B carried out in parallel to said step group A, said step group A comprising:

a step of inputting one transport route;

a deadlock determining step of determining whether each of said plurality of treatment chambers located on the inputted transport route is located at an upstream or downstream position on the inputted transport route with respect to said plurality of treatment chambers, and determining whether said inputted transport route and other transport routes registered in an upstream/downstream table cause a deadlock;

a step of additionally registering said inputted transport route in said upstream/downstream table when no deadlock occurs;

a step of registering said transport route in a transport holding route memory when a deadlock occurs; and said inputting step, said deadlock determining step, said step of additionally registering in said upstream/downstream table, and said step of registering in said transport holding route memory, with respect to transport routes other than said inputted transport route, and said step group B comprising:

a step of transporting said objects on a transport route, which does not cause a deadlock, in a vacuum chamber;

an upstream/downstream table updating step of updating said upstream/downstream table at a predetermined time; and a step of determining whether a transport route registered in said transport holding route memory and a transport route registered in said upstream/downstream table cause a deadlock, and additionally registering said transport line registered in said transport holding route memory when no deadlock occurs.

8. A deadlock avoidance method for objects to be treated, as set forth in claim 7, wherein said objects to be treated are semiconductor wafers.

9. A deadlock avoidance method for objects to be treated, as set forth in claim 7, wherein said upstream/downstream table is a table for storing an upstream/downstream information indicating whether each of said plurality of treatment chambers on each of said plurality of transport routes is located at an upstream or downstream position with respect to other treatment chambers of said plurality of treatment chambers, for each of said plurality of transport routes.

10. A deadlock avoidance method for objects to be treated, as set forth in claim 7, wherein said deadlock determining step determines that a deadlock occurs, when each of upstream/downstream information indicating whether each of said plurality of treatment chambers on a transport route intended to be additionally registered in said upstream/downstream table is located at an upstream or downstream position on the transport route with respect to other treatment chambers of said plurality of treatment chambers is not coincident with the corresponding upstream/downstream on other transport routes.

11. A deadlock avoidance method for objects to be treated, as set forth in claim 7, wherein said predetermined time at said upstream/downstream table updating step is a time that the last object belonging to one transport route registered in said upstream/downstream table exits a treatment chamber.

12. A deadlock avoidance method for objects to be treated, as set forth in claim 7, wherein said updating at said upstream/downstream table updating step is to delete a completely processed upstream/downstream information from said upstream/downstream table when the last object belonging to one transport route registered in said upstream/downstream table exits a treatment chamber.

13. A method for avoiding causing a deadlock in a common treatment chamber, which is one of a plurality of treatment chambers of a treatment system for transporting a plural different kinds of objects along a plural different kinds of transport routes to carry out predetermined treatments for the objects and which is common to different transport routes of the plural different kinds of transport routes for transporting different kinds of objects of the plural different kinds of objects, the treatment system comprising: a transfer chamber; a plurality of treatment chambers connected to said transfer chamber via gate valves, which are capable of establishing and blocking communications between said plurality of treatment chambers and said transfer chamber, for treating said objects; and a transport system, which is provided in said transfer chamber, for transporting said object between said treatment chambers, said deadlock avoidance method comprising the steps of:

a step of initializing an upstream/downstream table;

a step group A; and a step group B carried out in parallel to said step group A, said step group A comprising a step of inputting one transport route;

a deadlock determining step of determining whether each of said plurality of treatment chambers located on the inputted transport route is located at an upstream or downstream position on the inputted transport route with respect to said plurality of treatment chambers, and determining whether said inputted transport route and other transport routes registered in an upstream/downstream table cause a deadlock;

a step of additionally registering said inputted transport route in said upstream/downstream table when no deadlock occurs;

a step of registering said transport route in a transport holding route memory when a deadlock occurs; and said inputting step, said deadlock determining step, said step of additionally registering in said upstream/downstream table, and said step of registering in said transport holding router memory, with respect to transport routes other than said inputted transport route, and said step group B comprising:

a step of transporting said objects on a transport route, which does not cause a deadlock, in a vacuum chamber;

an upstream/downstream table updating step of updating said upstream/downstream table at a predetermined time; and a step of determining whether a transport route registered in said transport holding route memory and a transport route registered in said upstream/downstream table cause a deadlock, and additionally registering said transport line registered in said transport holding route memory when no deadlock occurs.

* * * * *